United States Patent [19]

Matsui

[11] Patent Number: 4,786,948
[45] Date of Patent: Nov. 22, 1988

[54] PRINTER

[75] Inventor: Hirotoshi Matsui, Nara, Japan

[73] Assignee: Sharp Kabushiki Kaisha, Osaka, Japan

[21] Appl. No.: 143,192

[22] Filed: Jan. 13, 1988

[30] Foreign Application Priority Data

Jan. 13, 1987 [JP] Japan ................................ 62-3682[U]

[51] Int. Cl.$^4$ .............................................. G03B 27/52
[52] U.S. Cl. ......................................... 355/40; 355/78
[58] Field of Search .............................. 355/40, 78, 79

[56] References Cited

U.S. PATENT DOCUMENTS 4,012,122  3/1977  McVeigh ............................. 355/40

Primary Examiner—Monroe H. Hayes
Attorney, Agent, or Firm—Birch, Stewart, Kolasch & Birch

[57] ABSTRACT

A printer which includes a lower cabinet, and an upper cabinet pivotally connected at its one end to the lower cabinet for selective opening or closing with respect to the lower cabinet. The lower cabinet is provided with a holder plate to place on it a photosensitive and heat-sensitive paper having a heat-sensitive layer to be sensitized by light and visualized by heat, and a set of heat fixing rollers for visualizing images by imparting heat to the photo-sensitive and heat-sensitive paper, while the upper cabinet is provided with a transparent liquid crystal display panel of a light transmitting type disposed at a position to confront the photo-sensitive and heat-sensitive paper placed on the holder plate, upon closure of the upper cabinet with respect to the lower cabinet so as to display images corresponding to input as applied by an external operation or external signal and a light source for projecting light onto the transparent liquid crystal panel from its upper portion.

3 Claims, 2 Drawing Sheets

PRINTER

BACKGROUND OF THE INVENTION

The present invention generally relates to a printing apparatus and more particularly, to a printer of a simplified type arranged to print out through employment of a photo-sensitive and heat-sensitive paper having a diazo heat-sensitive material capable of being sensitized by light and visualized by heat as a heat-sensitive layer.

Conventionally, there has been proposed a copying apparatus utilizing a photo-sensitive and heat-sensitive paper as referred to above, and so arranged that, by projecting light onto a recording medium on which characters, figures, etc. are recorded, light reflected therefrom is read by a CCD image sensor, and the read data subjected to photoelectric conversion by said sensor is further subjected to digital treatment for thermal recording by a thermal head so as to be subsequently fixed through irradiation of light. Meanwhile, there has also been known a thermal printer so arranged that, by driving a thermal head based on recording data to be inputted as an external signal, information is thermally recorded on a photo-sensitive and heat-sensitive paper for subsequent fixing through irradiation of light.

However, in the conventional arrangements as described above, due to the construction for electrically processing the image, many electrical components such as an image reading device, an image processing device and a printing device, etc. are involved for a large size of the arrangement on the whole, thus resulting in a disadvantage, for example, that the apparatus can not be readily carried about. Moreover, since any of the reading device, processing device and printing device is generally expensive, cost of the entire apparatus tends to be so high that it is not suitable for use at home in general.

SUMMARY OF THE INVENTION

Accordingly, an essential object of the present invention is to provide a simplified printer utilizing a photo-sensitive and heat-sensitive paper, which is of a type readily carried about, with operability for simple use, and also has a function for use as a copy apparatus.

Another important object of the present invention is to provide a printer of the above described type at a low cost so that it can be readily purchased for use at home in general, etc.

In accomplishing these and other objects, according to one preferred embodiment of the present invention, there is provided a printer which includes a lower cabinet, and an upper cabinet pivotally connected at its one end to said lower cabinet for selective copying or closing thereof with respect to the lower cabinet. The lower cabinet is provided with a holder plate to place thereon a photo-sensitive and heat-sensitive paper having a heat-sensitive layer to be sensitized by light and visualized by heat, and a set of heat fixing rollers for visualizing images by imparting heat to the photo-sensitive and heat-sensitive paper, while the upper cabinet is provided with a transparent liquid crystal display panel of a light transmitting type disposed at a position to confront the photo-sensitive and heat-sensitive paper placed on said holder plate, upon closure of said upper cabinet with respect to said lower cabinet so as to display images corresponding to input as applied by an external operation or external signal and a light source for projecting light onto said transparent liquid crystal panel from an upper portion thereof.

By the above arrangement, with the desired information displayed by characters and figures on the transparent liquid crystal display panel through the external operation or input of external signal, when light is projected from the light source onto the liquid crystal display panel, the characters, figures, etc. on the display are sensitized onto the photo-sensitive and heat-sensitive paper by the light transmitted through said display panel. Upon application of heat to this sensitized photo-sensitive and heat-sensitive paper by the heat fixing rollers, the characters, figures, etc. are visualized on the photo-sensitive and heat-sensitive paper for recording of the desired information

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE INVENTION

Figure 1:
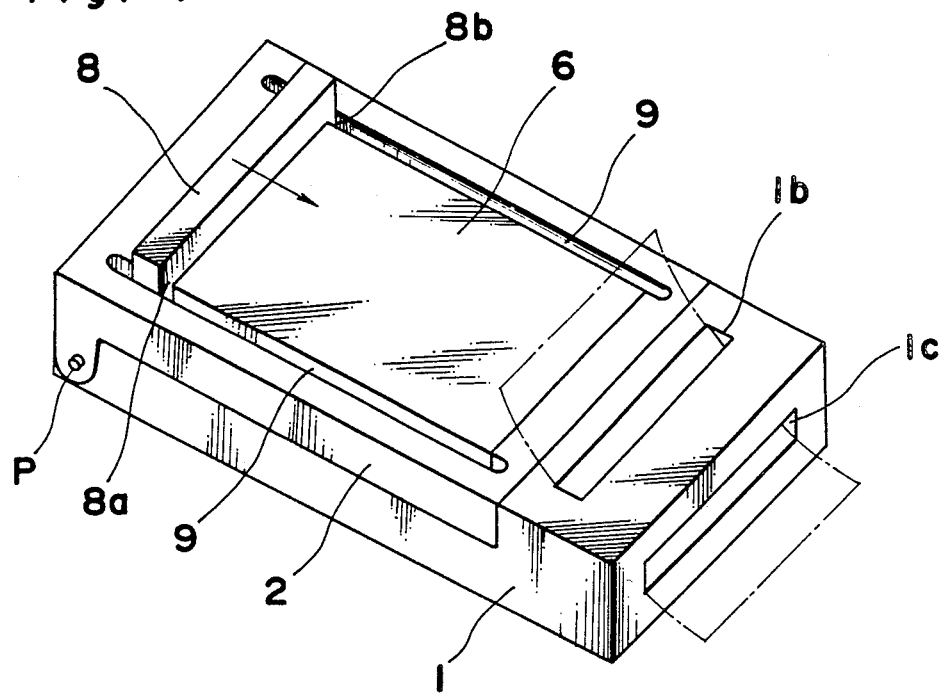
FIG. 1 is a perspective view of a printer according to one preferred embodiment of the present invention.

Before the description of the present invention proceeds, it is to be noted that like parts are designated by like reference numerals throughout the accompanying drawings.

Figure 2:
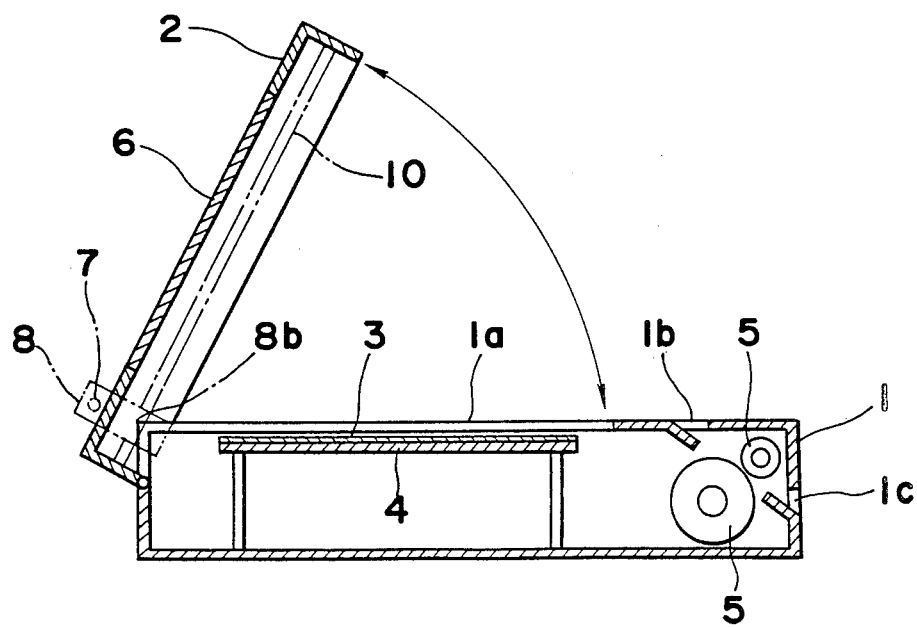
FIG. 2 is a longitudinal sectional view of the printer of FIG. 1.

Referring now to the drawings, there is shown in FIGS. 1 and 2 a printer or printing apparatus according to one preferred embodiment of the present invention, which generally includes a lower cabinet 1 and an upper cabinet 2 so as to constitute an outer casing for the apparatus on the whole. The upper cabinet 2 is pivotally connected, at its one end, to the lower cabinet 1 for rotation about a pivotal point P in the directions indicated by arrows in FIG. 2. for selective opening or closing of an upper opening 1a of said lower cabinet.

The lower cabinet 1 is provided with a holder plate 4 horizontally disposed in the vicinity of the upper opening 1a for supporting a photo-sensitive and heat-sensitive paper sheet 3 (referred to merely as a paper sheet hereinafter) to be placed thereon, a set of heat fixing rollers 5 for applying heat to the paper sheet 3, and an insertion opening 1b and a discharge opening 1c of the paper sheet 3 with respect to the heat fixing rollers 5.

On the other hand, the upper cabinet 2 includes a transparent liquid crystal display panel 6 of a light-transmitting type for displaying desired information in characters, figures, etc. by external operations or through signal inputs from external appliances, a light source 7 of a fluorescent lamp for projecting light onto said display panel 6, and a light source unit 8 which holds said light source 7 for movement thereof over the display panel 6 in a direction indicated by an arrow in FIG. 1. The transparent liquid crystal display panel 6 referred to above is fitted in the upper cabinet 2 in a position where it confronts the paper sheet 3 on the holder plate 4 when said upper cabinet 2 is turned down or closed with respect to the lower cabinet 1. Meanwhile, the light source unit 8 has leg portions 8a and 8b depending downwardly from opposite sides at its one end, and said leg portions 8a and 8b are extended through corresponding guide grooves 9, each formed between the display panel 6 and the upper cabinet 2, with the lower ends of the leg portions 8a and 8b being movably supported on guide rails 10 provided below said guide grooves 9 so as to be displaced at a predetermined speed by a driving system (not shown).

As is seen from FIG. 2, in the above embodiment, in order to achieve compact size of the apparatus, there is shown the case where a cut paper sheet is employed as the photo-sensitive and heat-sensitive paper sheet 3, and it is so arranged that the sensitized cut sheet 3 is inserted through the insertion opening 1b towards the heat fixing rollers 5 by manual operation of an operator.

Figure 3:
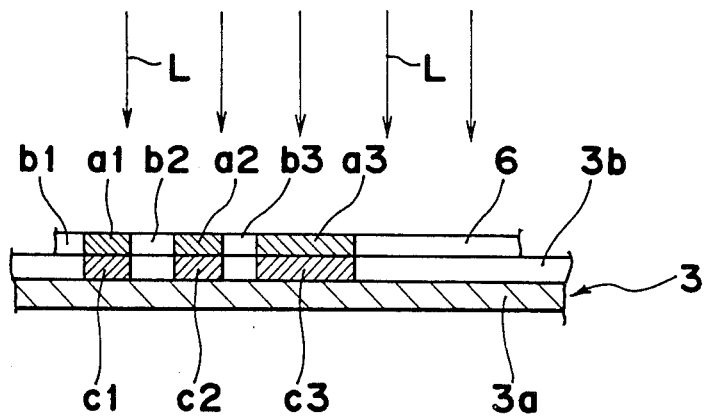
FIGS. 3 and 4 are fragmentary sectional diagrams for explaining functions of the printer of FIG. 1.
Figure 4:
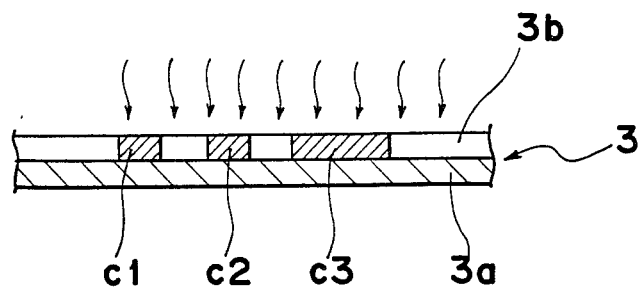

Referring also to FIGS. 3 and 4, functions of the printer according to the present embodiment as described so far will be explained hereinafter.

In the first place, as shown in FIG. 2, the paper sheet 3 is set on the holder plate 4, with the upper cabinet 2 raised upwardly, and then, said upper cabinet 2 is pivoted downwardly onto the lower cabinet 1 for closure so as to cover the opening 1a of said lower cabinet 1. Thereafter, desired information is displayed on the transparent liquid crystal display panel 6 in characters, figures, etc. through operation of an external operating section or by signal input of recorded data by an external appliance (not particularly shown).

When the desired information has been displayed on the display panel 6, the light source unit 8 is moved at a constant speed in the direction of the arrow in FIG. 1 so as to uniformly subject the entire display panel 6 to light irradiation by the light source 7. As shown in FIGS. 3 and 4, the photo-sensitive and heat-sensitive paper sheet 3 placed on the holder plate 4 is constituted by a support sheet 3a of paper, synthetic resin film or the like, and a heat-sensitive layer 3b containing diazo compound, coupling component and color producing agent and formed on said support sheet 3a, and is capable of suspending color production or development (i.e., fixing) through decomposition of unreacted diazo compound by the light irradiation after thermal recording. As shown in FIG. 3, when the display panel 6 is subjected to light projection by the light source 7 from above, since the display panel at this time has opaque portions a1, a2 and a3 which are the display portions of the figures, characters, etc., and other transparent portions b1, b2 and b3, said opaque portions a1, a2 and a3 shield the light, while the transparent portions b1, b2 and b3 allow the light to be transmitted so as to impart light energy to the heat-sensitive layer 3b of the photo-sensitive and heat-sensitive paper sheet 3.

Accordingly, light energy is not imparted to portions c1, c2 and c3 of the heat-sensitive layer 3b corresponding to the opaque portions a1, a2 and a3 of the display panel 6, and it is given only to other portions of the heat-sensitive layer 3b corresponding to the transparent portions b1, b2 and b3 of said display panel 6, whereby latent images corresponding to the display on the transparent liquid crystal display panel 6 are formed on the heat-sensitive layer 3b. More specifically, at the portions of the heat-sensitive layer 3b subjected to irradiation of light rays L, unreacted diazo compound is decomposed to stop color development or production, i.e., so as to be fixed, while, at the portions c1, c2 and c3 of the layer 3b not irradiated by the light rays L, the unreacted diazo compound remains as it is, thereby to form the latent images.

As described so far, when the latent images are formed on the photo-sensitive and heat-sensitive paper sheet 3 through scanning by the light source 7, the upper cabinet 2 is again raised to take out the paper sheet 3, which is then inserted through the insertion opening 1b with respect to the heat fixing rollers 5. In this case, said heat fixing rollers 5 uniformly heat the entire surface of the heat-sensitive layer 3b, and since the unexposed portions c1, c2 and c3 of the heat-sensitive layer 3b remain to be in the state of the unreacted diazo compound as it is, color is developed by the heat to visualize the characters and figures, while, at the other portions of said layer 3b where the unreacted diazo compound has already been decomposed by the light energy, no color is developed by the heat, whereby the images on the paper sheet 3 are visualized by the entire surface heating, and then, said paper sheet 3 is discharged from the discharge opening 1.

Moreover, it is possible to print out information directly written for addition on the display panel 6 by "magic ink" or the like, in composition with the original information of the display panel 6. Furthermore, with the display panel 6 maintained in an entirely transparent state without any display, if an original document prepared by writing information on a light transmitting type paper such as tracing paper or the like, is placed on said display panel 6 having no display, the printer may also be used as a copying apparatus.

As is clear from the foregoing description, according to the printer of the present invention, since it is so arranged that, after formation of the latent images on the photo-sensitive and heat-sensitive paper sheet placed to confront the transparent liquid crystal display panel through light projection onto said display panel for displaying desired information, images are visualized by imparting heat to said paper sheet by means of the heat fixing rollers, the formation of images is effected through optical processing, thereby making it possible to dispense with expensive electrical components such as an image reading device, etc., and thus, the printer can be formed in a compact size so as to be easily carried about through an extremely simple construction at low cost. Moreover, since the printer is very easy to operate, it may be readily used at home in general as a simplified type printer.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A printer which comprises a lower cabinet, and an upper cabinet pivotally connected at its one end to said lower cabinet for selective opening or closing thereof with respect to the lower cabinet, said lower cabinet being provided with a holder plate to place thereon a photo-sensitive and heat-sensitive paper having a heat-sensitive layer to be sensitized by light and visualized by heat, and a set of heat fixing rollers for visualizing images by imparting heat to the photo-sensitive and heat-sensitive paper, said upper cabinet being provided with a transparent liquid crystal display panel of a light transmitting type disposed at a position to confront the photo-sensitive and heat-sensitive paper placed on said holder plate, upon closure of said upper cabinet with respect to said lower cabinet so as to display images corresponding to input as applied by an external operation or external signal, and a light source for projecting light onto said transparent liquid crystal panel from an upper portion thereof.

2. A printer as claimed in claim 1, wherein said transparent liquid crystal display panel serves as a platform for directly writing information thereon by other writing means so as to print out the written information in composition with the information displayed on said panel.

3. A printer as claimed in claim 1, wherein said transparent liquid crystal display panel kept entirely transparent without any display, serves as a platform for placing thereon an original document prepared by writing information on a light-transmitting type sheet, thereby to utilize the printer as a copying apparatus.

* * * * *